(12) United States Patent
Ishikawa

(10) Patent No.: US 8,434,658 B2
(45) Date of Patent: May 7, 2013

(54) JOINING METHOD AND REFLOW APPARATUS

(75) Inventor: Tetsuji Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/090,858

(22) Filed: Apr. 20, 2011

(65) Prior Publication Data

US 2011/0192536 A1    Aug. 11, 2011

Related U.S. Application Data

(62) Division of application No. 12/642,946, filed on Dec. 21, 2009, now Pat. No. 7,975,898.

(30) Foreign Application Priority Data

Jan. 8, 2009   (JP) ................................. 2009-002515

(51) Int. Cl.
  *B23K 20/00* (2006.01)
(52) U.S. Cl.
  USPC ................. 228/102; 228/8; 228/9; 228/103; 228/108; 228/109
(58) Field of Classification Search .................. 228/8, 9, 228/102, 103, 108, 109
  See application file for complete search history.

(56) References Cited

U.S. PATENT DOCUMENTS

| | | | | |
|---|---|---|---|---|
| 4,195,820 A | * | 4/1980 | Berg | 266/87 |
| 4,538,757 A | * | 9/1985 | Bertiger | 228/180.1 |
| 4,921,156 A | * | 5/1990 | Hohnerlein | 228/37 |
| 5,031,818 A | * | 7/1991 | Gieskes | 228/42 |
| 5,044,542 A | * | 9/1991 | Deambrosio | 228/37 |
| 5,409,543 A | * | 4/1995 | Panitz et al. | 134/2 |
| 5,573,174 A | | 11/1996 | Pekol | |
| 6,478,215 B2 | * | 11/2002 | Zen | 228/260 |
| 6,902,100 B2 | | 6/2005 | Biedorf et al. | |
| 7,780,057 B2 | | 8/2010 | Kishi et al. | |
| 2002/0057986 A1 | * | 5/2002 | Chew et al. | 420/562 |
| 2003/0168495 A1 | * | 9/2003 | Biedorf et al. | 228/180.21 |
| 2003/0222126 A1 | * | 12/2003 | Morozumi et al. | 228/219 |
| 2004/0082159 A1 | | 4/2004 | Shieh et al. | |

FOREIGN PATENT DOCUMENTS

| | | |
|---|---|---|
| JP | 10-322010 A | 12/1998 |
| JP | 2001-58259 A | 3/2001 |
| JP | 2004-273654 | 9/2004 |
| JP | 2006-165402 A | 6/2006 |
| JP | 2008-182120 | 8/2008 |

OTHER PUBLICATIONS

USPTO, (MEHTA) Notice of Allowance and Notice of Allowability, May 2, 2011, in U.S. Appl. No. 12/642,946 [now allowed].
USPTO, [MEHTA] "U.S. Appl. No. 12/642,946 (parent)," [CTRS] Requirement for Restriction/Election issued on Mar. 7, 2011.

(Continued)

*Primary Examiner* — Erin Saad
(74) *Attorney, Agent, or Firm* — Fujitsu Patent Center

(57) ABSTRACT

A joining method includes melting a hot melt joining material provided between a board and a component to be joined to the board; and reducing the pressure of the ambient atmosphere of the hot melt joining material and tilting the board while the hot melt joining material is in a molten state.

10 Claims, 13 Drawing Sheets

OTHER PUBLICATIONS

Figure 2A:
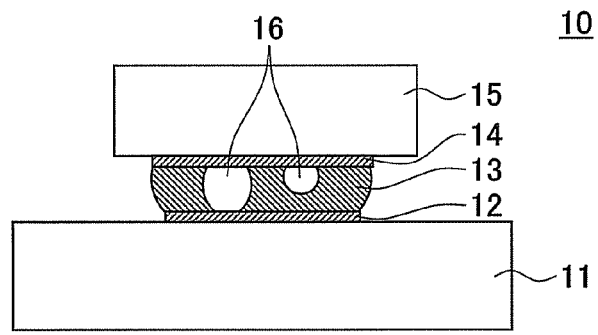

United Kingdom Search Report, mailed by Great Britain Patent Office and Corresponding to UK Application No. GB0921539.3 on Mar. 11, 2010.

Japanese Office Action mailed Dec. 4, 2012 for corresponding Japanese Application No. 2009-002515, with partial English-language translation.

* cited by examiner

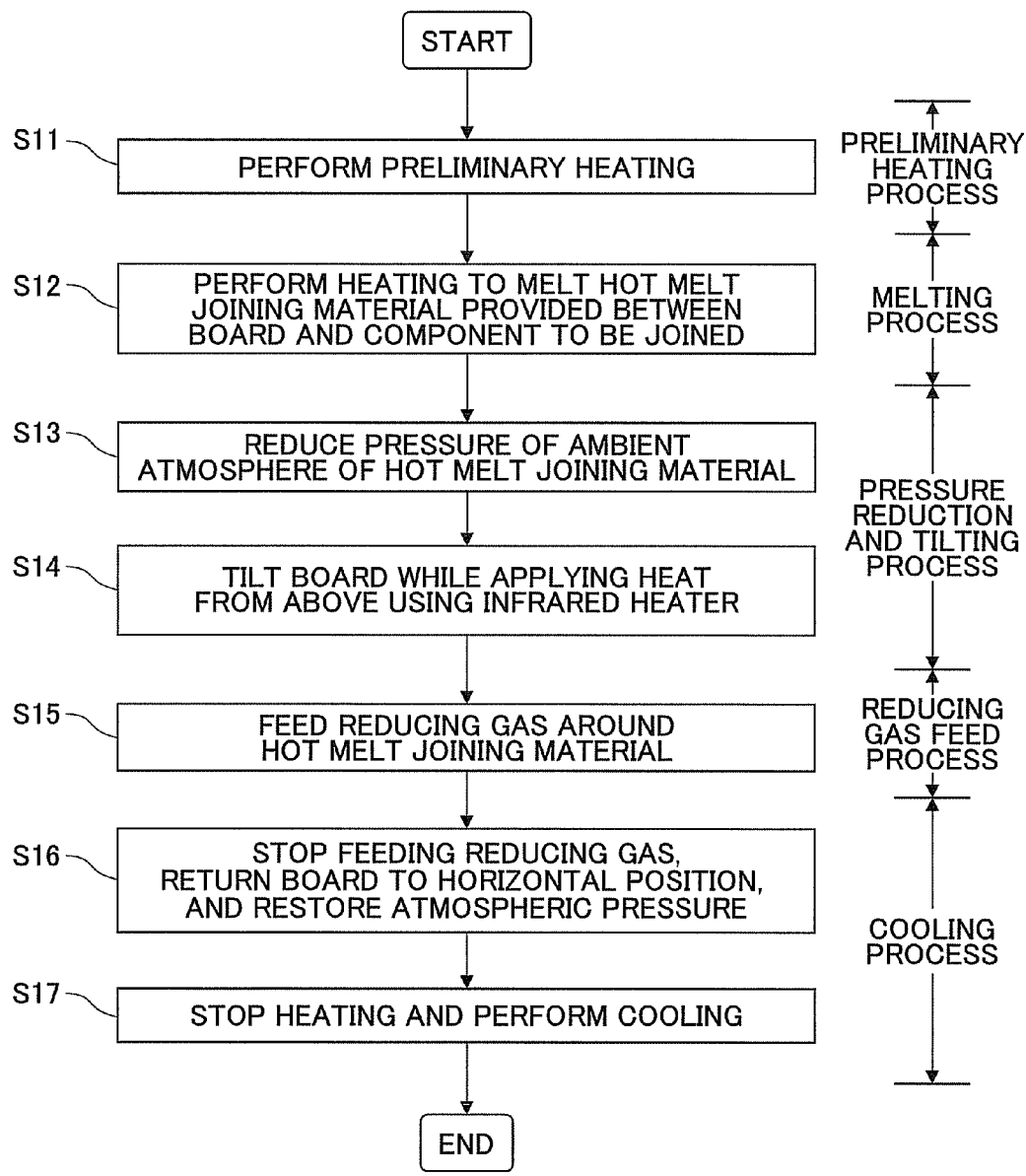

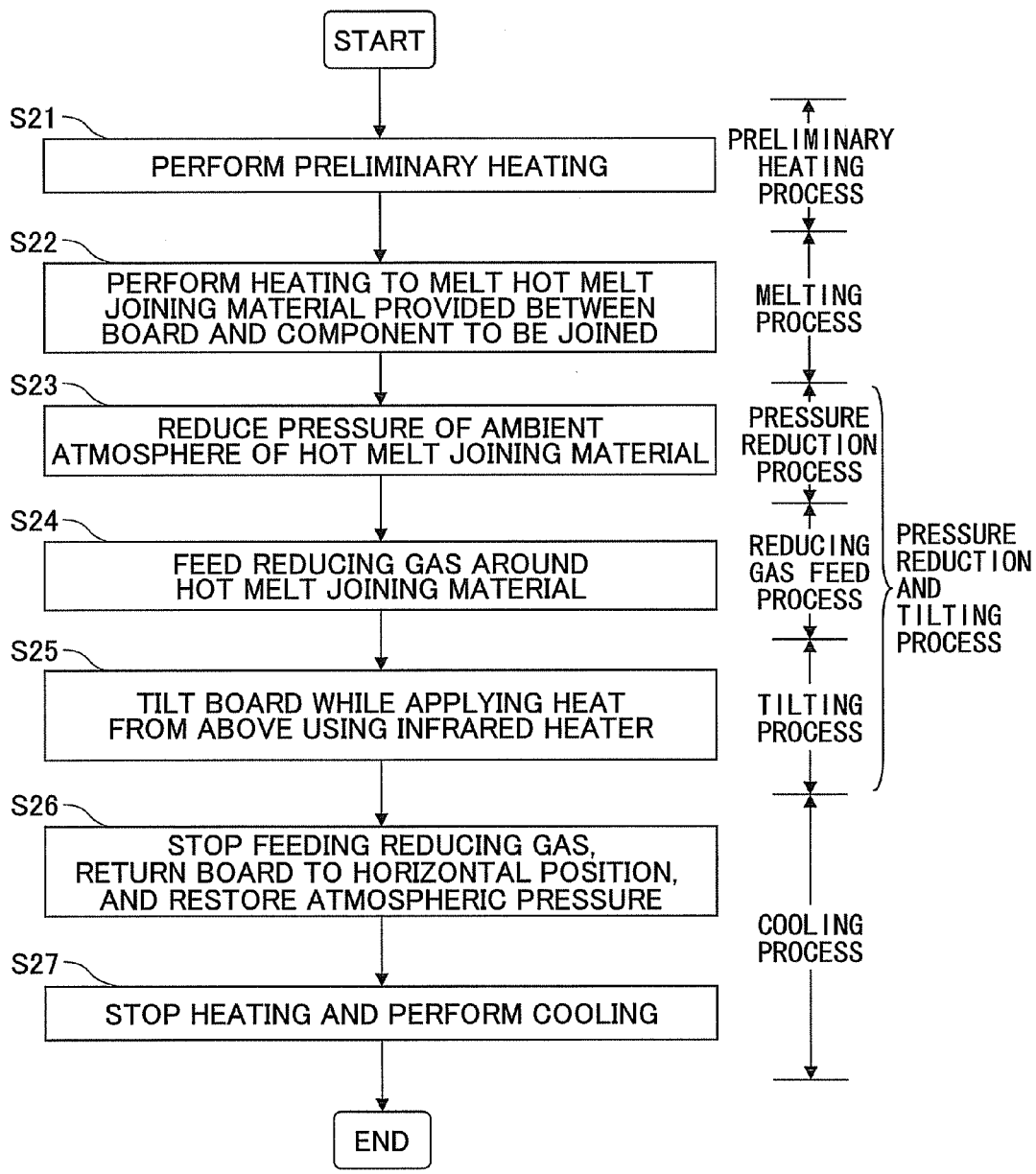

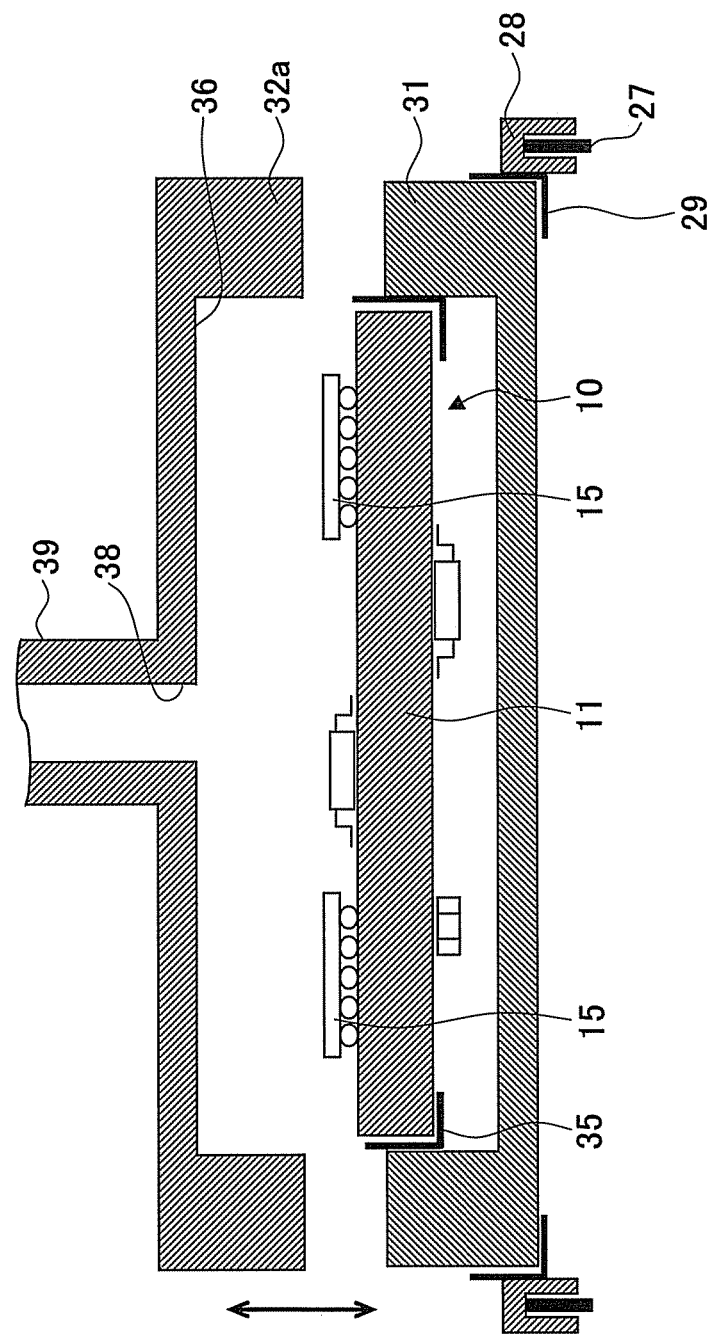

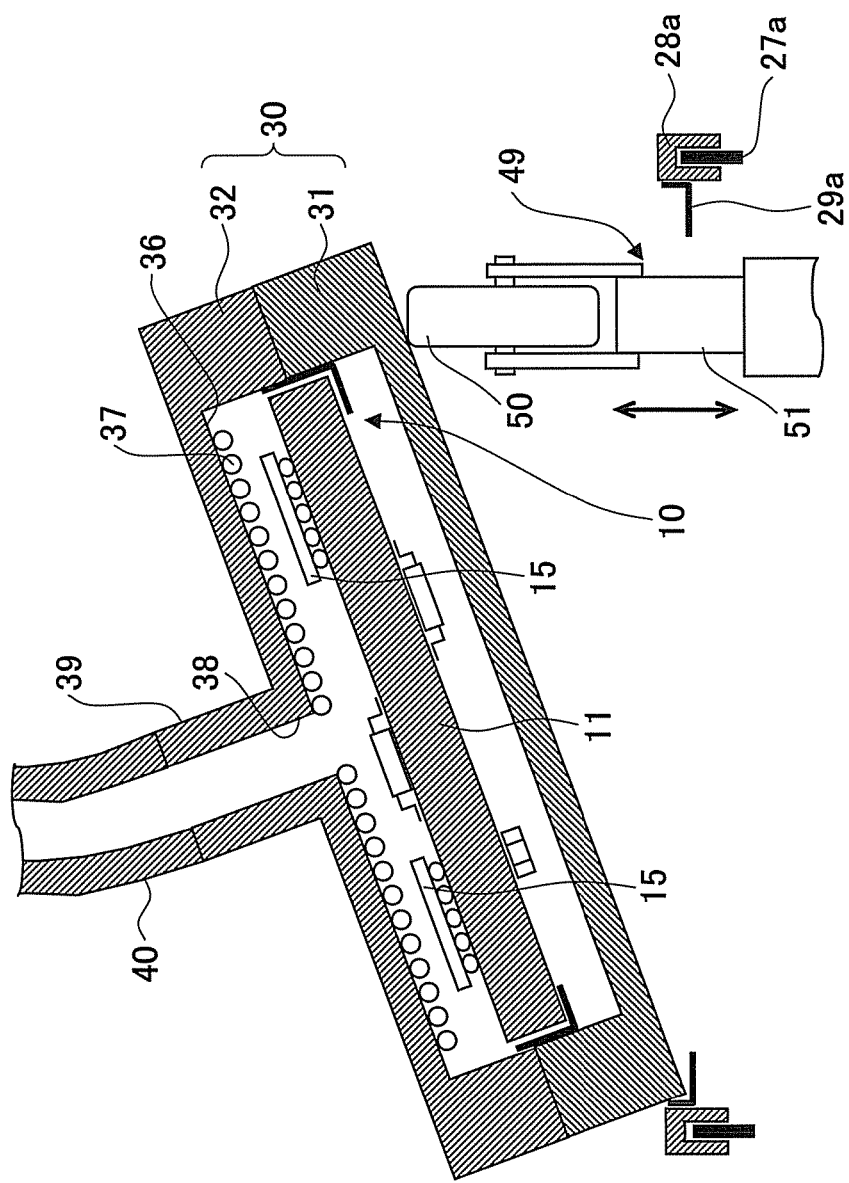

JOINING METHOD AND REFLOW APPARATUS

CROSS-REFERENCE TO RELATED APPLICATION

The present application is based upon and claims the benefit of priority of the prior Japanese Patent Application No. 2009-002515, filed on Jan. 8, 2009, the entire contents of which are incorporated herein by reference.

FIELD

A certain aspect of the embodiments discussed herein is related to a joining method and a reflow apparatus.

BACKGROUND

In recent years, there has been an increasing demand for more sophisticated electronic apparatuses or electronic apparatuses having more functions. In order for electronic apparatuses to be more sophisticated or have more functions, it is necessary to increase the size of components to be mounted in the electronic apparatuses. Further, it is necessary for the components of the electronic apparatuses to have terminals including I/O (input/output) terminals provided on their bottom surfaces like packages such as BGA (Ball Grid Array), LGA (Land Grid Array), BCC (Bump Chip Carrier), and QFN (Quad Flat Non-leaded package). That is, components having large bottom surfaces have been mounted on a board by being joined and electrically connected to the board at their bottom surfaces. In such joining, soldering is employed.

With respect to the material quality of solder used in soldering electronic apparatus components to a board, leaded solder has been replaced with lead-free solder in response to demands for addressing environmental issues. The melting point of lead-free solder is commonly higher than the melting point of leaded solder. For example, the melting point of 60/40 (wt %) Sn/Pb leaded solder is 183° C., and the melting point of 96.5/3/0.5 (wt %) Sn/Ag/Cu lead-free solder is 217° C. Accordingly, replacing leaded solder with lead-free solder causes an increase in soldering temperature.

In the case of soldering a component with terminals provided on its bottom surface to a board using such lead-free solder, voids are generated in the solder when the solder melts. The reaction that generates voids in lead-free solder is as follows:

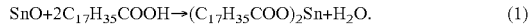

$$SnO + 2C_{17}H_{35}COOH \rightarrow (C_{17}H_{35}COO)_2Sn + H_2O. \quad (1)$$

Here, if the soldering temperature is high, tin (Sn) in the lead-free solder is oxidized into tin oxide (SnO), and the tin oxide reacts with a carboxylic acid contained in a flux to generate water ($H_2O$) as illustrated in Eq. (1). The water, which is generated as vapor, causes voids to be generated in the solder.

Further, $(C_{17}H_{35}COO)_2Sn$, which is a reaction product of the tin (Sn) and the carboxylic acid, reacts with the copper (Cu) of interconnects to result in solder joints as follows:

$$(C_{17}H_{35}COO)_2Sn + Cu \rightarrow (C_{17}H_{35}COO)_2Cu + Sn. \quad (2)$$

Here, the voids generated by the reaction illustrated in Eq. (1) reside between the bottom surface of the component and the board. The residence of the voids tilts the component, causes poor joining, or generates space in the solder, thus decreasing the reliability of soldering (solder joints). In particular, in the case of using lead-free solder, tin (Sn) in the lead-free solder is more likely to be oxidized because of higher soldering temperatures. This increases tin oxide (SnO) to accelerate the reaction illustrated in Eq. (1), so that generation of water ($H_2O$) is accelerated to increase the amount of void generation.

Several methods have been proposed as joining methods that discharge voids generated in such soldering outside the solder.

For example, Japanese Laid-open Patent Publication No. 2006-165402 describes a method where a component and a board are placed and heated on a hot plate, and voids are discharged outside solder by tilting the board while observing the voids using X-rays.

Further, Japanese Laid-open Patent Publication No. 2001-58259 describes a method where voids are discharged outside solder by heating a board in a vacuum filled with hydrogen, which is a reducing gas.

SUMMARY

According to an aspect of the invention, a joining method includes melting a hot melt joining material provided between a board and a component to be joined to the board; and reducing a pressure of an ambient atmosphere of the hot melt joining material and tilting the board while the hot melt joining material is in a molten state.

According to an aspect of the invention, a reflow apparatus includes a plurality of process vessel body parts each having an opening open upward and configured to house an object of processing, the object of processing including a board and a component to be joined to the board, the component to be joined being placed over the board with a hot melt joining material interposed therebetween; a conveyance part configured to convey the process vessel body parts sequentially along a conveyance path; and a process vessel upper lid part configured to be combined with each of the process vessel body parts to form an airtight process vessel by being mounted on the process vessel body part to close the opening in the conveyance path, wherein the conveyance part includes a tilt part configured to tilt the object of processing together with the process vessel.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWING(S)

Figure 3:
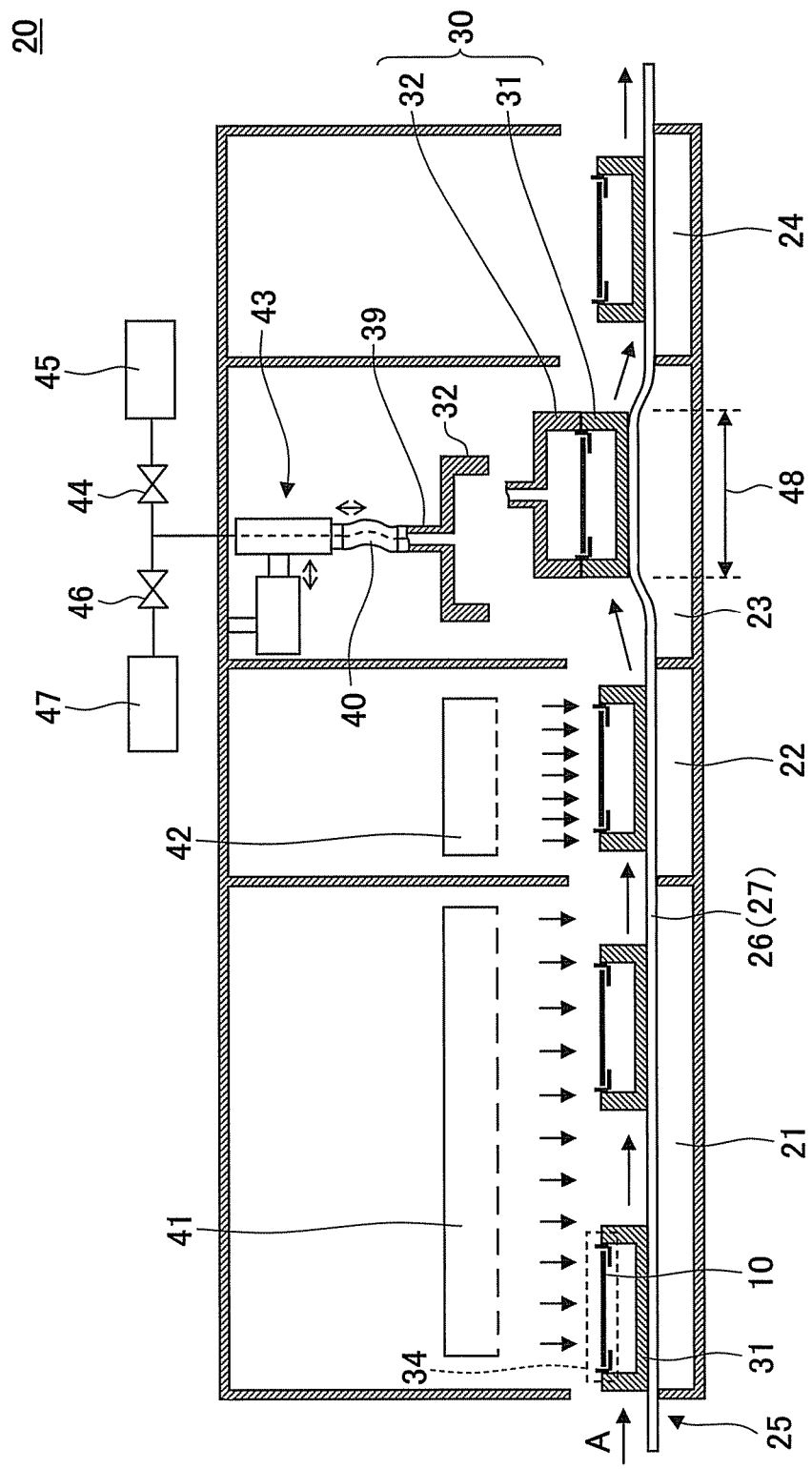
Figure 7:
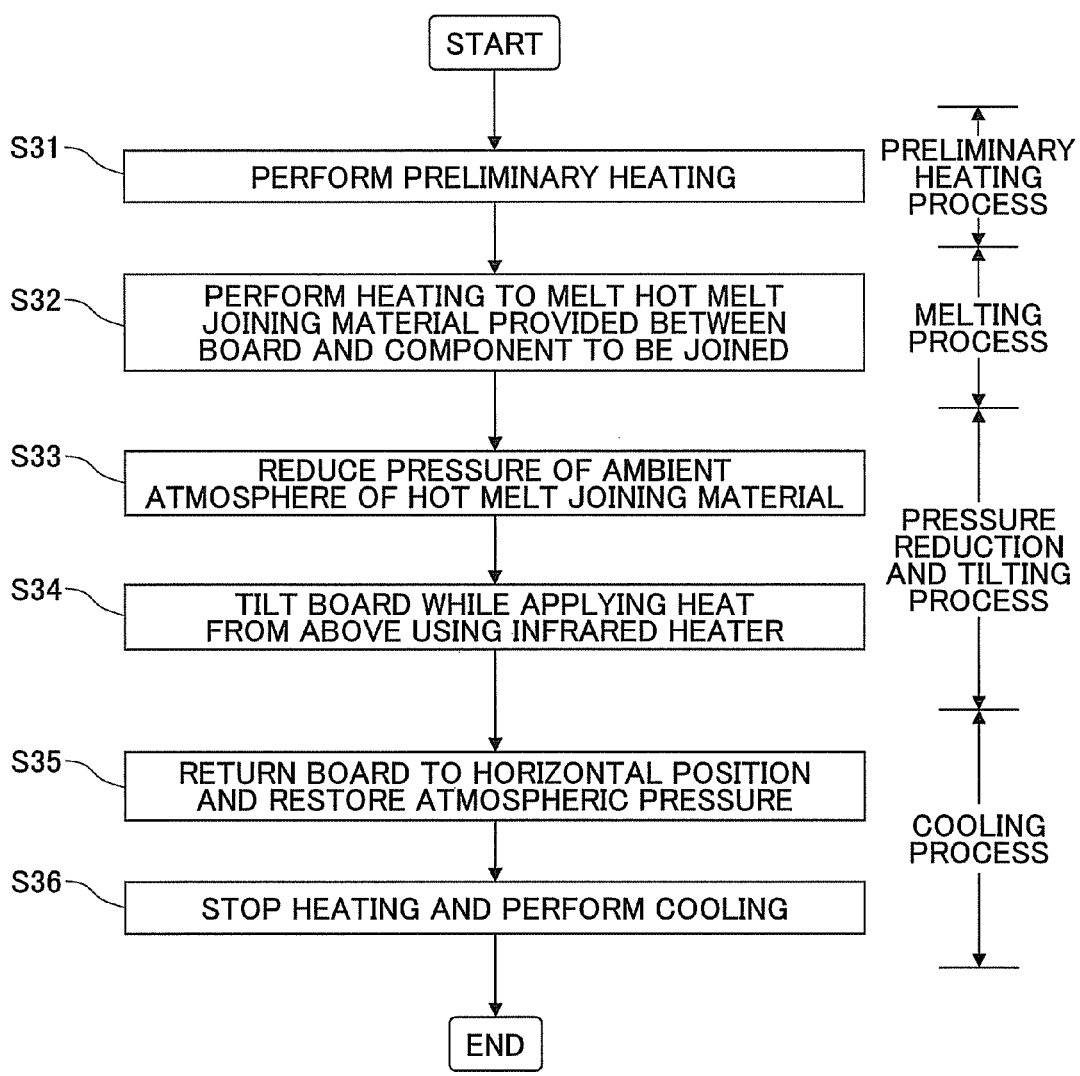
Figure 8A:
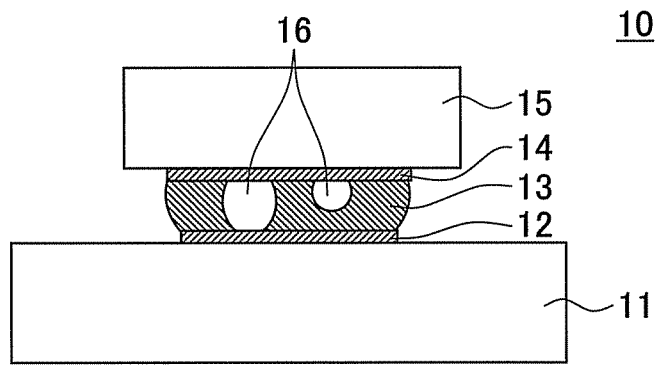
Figure 8B:
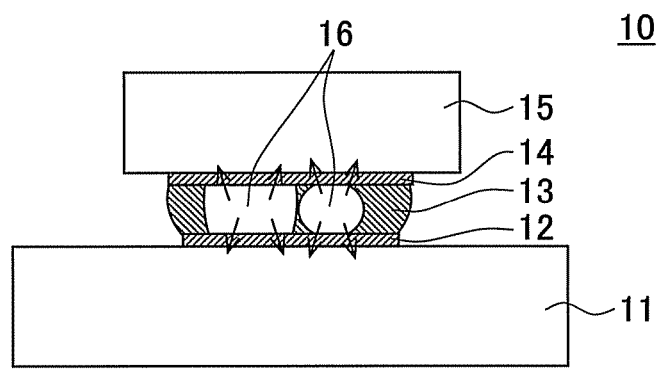
Figure 8C:
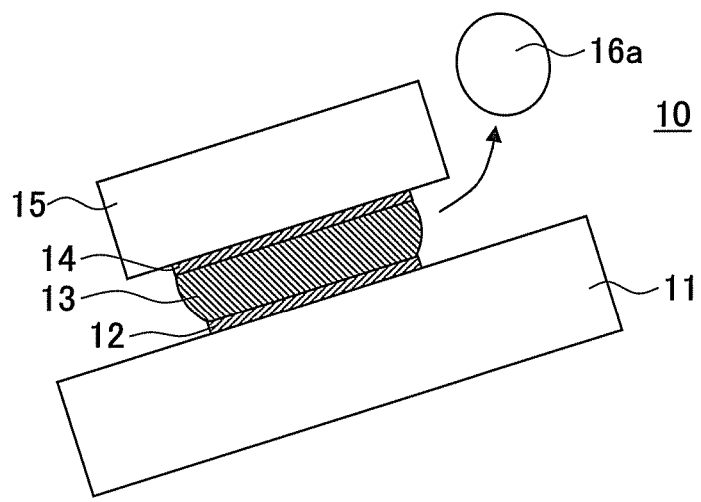
Figure 10:
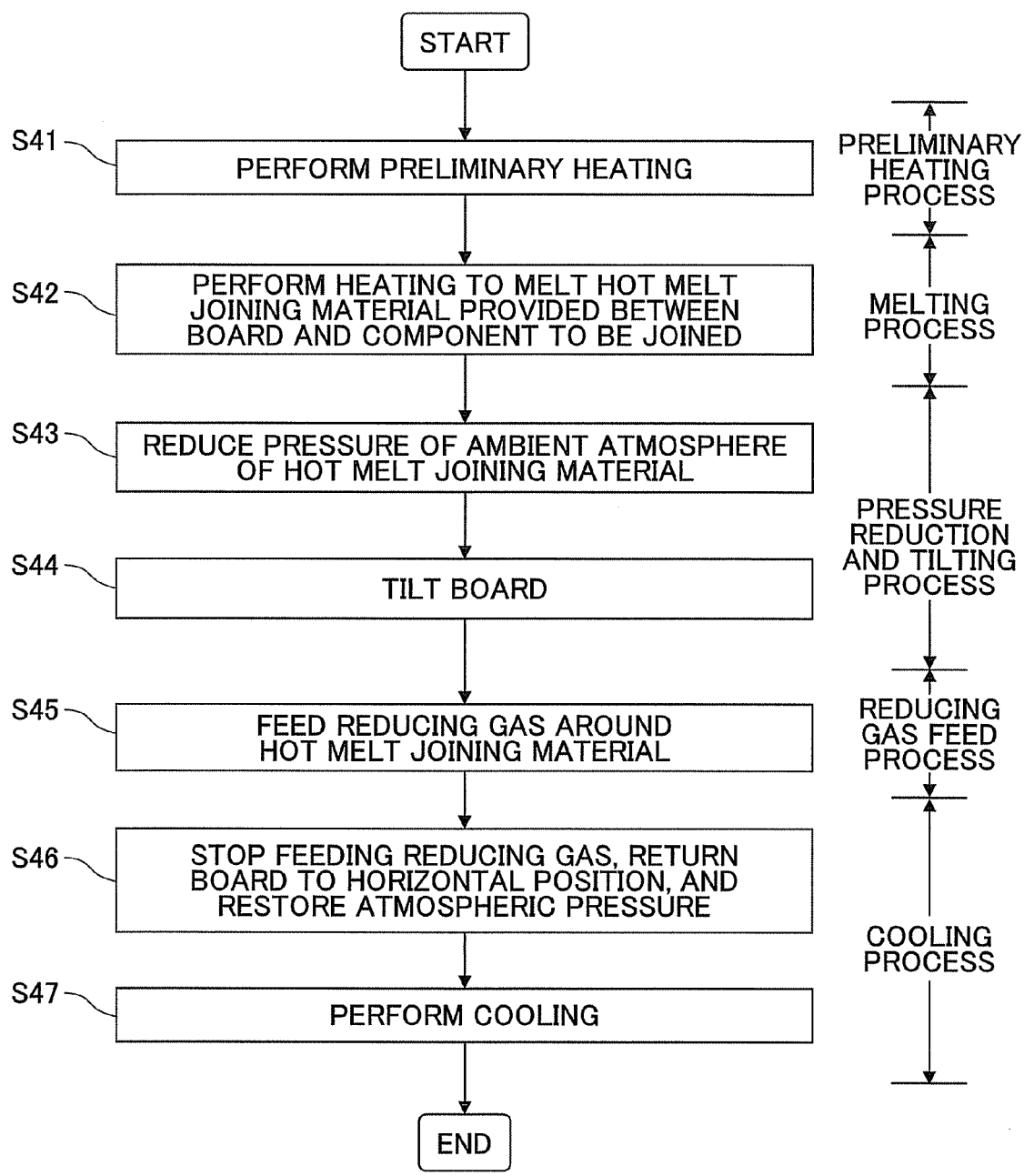
Figure 11:
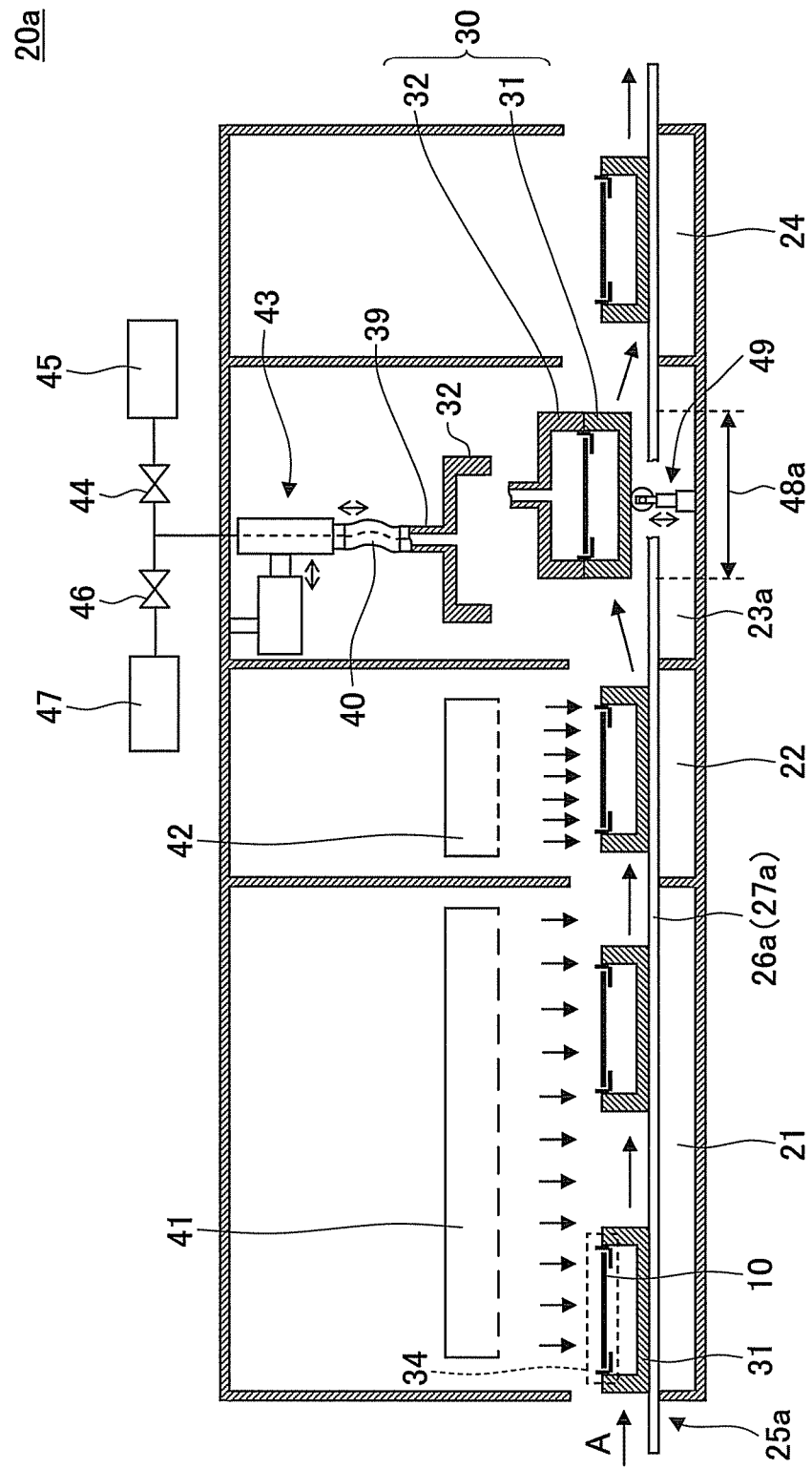

FIG. 1 is a flowchart for illustrating processes of a joining method according to a first embodiment;

FIGS. 2A through 2D, which are diagrams for illustrating the joining method according to the first embodiment, are schematic cross-sectional views of an object of processing in respective processes;

FIG. 3 is a schematic cross-sectional view of a reflow apparatus according to the first embodiment;

FIGS. 4A through 4D, which are diagrams for illustrating the reflow apparatus according to the first embodiment, are cross-sectional views of a process vessel body part and/or a process vessel upper lid part when viewed in the direction indicated by arrow A in FIG. 3, illustrating states before and after the process vessel upper lid part is mounted on the process vessel body part in a pressure reduction and tilting chamber;

FIG. 5 is a flowchart for illustrating processes of a joining method according to a first variation of the first embodiment;

FIGS. 6A through 6D, which are diagrams for illustrating the joining method according to the first variation of the first embodiment, are schematic cross-sectional views of the object of processing in respective processes;

FIG. 7 is a flowchart for illustrating processes of a joining method according to a second variation of the first embodiment;

FIGS. 8A through 8C, which are diagrams for illustrating the joining method according to the second variation of the first embodiment, are schematic cross-sectional views of the object of processing in respective processes;

FIG. 9, which is a diagram for illustrating a reflow apparatus according to a third variation of the first embodiment, is a schematic cross-sectional view of a process vessel upper lid part;

FIG. 10 is a flowchart for illustrating processes of a joining method according to the third variation of the first embodiment;

FIG. 11 is a schematic cross-sectional view of a reflow apparatus according to a second embodiment; and FIG. 12, which is a diagram for illustrating the reflow apparatus according to the second embodiment, is a cross-sectional view of a process vessel when viewed in the direction indicated by arrow A in FIG. 11, illustrating a state where the process vessel has been conveyed to a tilt zone of a pressure reduction and tilting chamber and is tilted in a single body.

DESCRIPTION OF EMBODIMENTS

However, in the case of discharging voids outside solder by tilting a board or heating a board in a reducing gas as described above, the following are possible.

According to the method that discharges voids outside solder by heating a component and a board and tilting the board while observing the voids using X-rays, of the voids, which vary in size from small to large and are scattered, those smaller in size are slower in moving upward in the solder. Further, an oxide film is likely to be formed on the surface of the solder so as to prevent voids from being discharged outside the solder.

According to the method that discharges voids outside solder by heating a board in a vacuum filled with a reducing gas, it is difficult to cause voids to move because the bottom surface of the component is parallel to a horizontal plane, thus preventing the voids from being discharged outside the solder.

Therefore, it is desired that a joining method and a reflow apparatus be developed that ensure discharging voids outside solder and prevent poor joining (soldering) in soldering a large-area component having a bottom surface provided with terminals to a board using lead-free solder.

Preferred embodiments of the present invention are explained below with reference to accompanying drawings.

[a] First Embodiment

A description is given, with reference to FIG. 1, FIGS. 2A through 2D, FIG. 3, and FIG. 4, of a joining method and a reflow apparatus according to a first embodiment of the present invention.

First, a description is given, with reference to FIG. 1 and FIGS. 2A through 2D, of a joining method according to this embodiment. In this embodiment, a joining method using lead-free solder is described as an example.

FIG. 1 is a flowchart for illustrating processes of a joining method according to this embodiment. FIGS. 2A through 2D, which are diagrams for illustrating the joining method according to this embodiment, are schematic cross-sectional views of an object to be processed (an object of processing) 10 in respective processes. The cross-sectional view of FIGS. 2A through 2D correspond to the object of processing 10 after the processes of steps S12, S13, S14, and S15, respectively, of FIG. 1. By way of example, the object of processing 10 according to this embodiment includes a board 11 and a component to be joined 15, which is placed over an electrode 12 of the board 11 through a hot melt joining material 13 to have an electrode 14 joined to the board 11 as illustrated in FIG. 2A.

As illustrated in FIG. 1, the joining method according to this embodiment includes a preliminary heating process, a melting process, a pressure reduction and tilting process, a reducing gas feed process, and a cooling process. The preliminary heating process includes the process of step S11. The melting process includes the process of step S12. The pressure reduction and tilting process includes the processes of steps S13 and S14. The reducing gas feed process includes the process of step S15. The cooling process includes the processes of steps S16 and S17.

First, the preliminary heating process including step S11 is performed. In the preliminary heating process, the object of processing 10 is subjected to preliminary heating at a temperature not so high as to melt the hot melt joining material 13. Further, the preliminary heating process prevents the object of processing 10 from suffering from damage such as peeling due to a difference in expansion between its parts caused by a sudden change in temperature in the subsequent melting process.

According to this embodiment, by way of example, 96.5/3/0.5 (wt %) Sn/Ag/Cu lead-free solder may be used. The melting point of lead-free solder having this composition is 217° C. Example conditions such as a temperature and a time in each process of the joining method according to this embodiment are illustrated in Table 1 below.

TABLE 1

| PROCESS | HEATING/COOLING METHOD | HEAT-UP/COOLING RATE (° C./s) | TEMP. (° C.) | TIME (s) | VACUUM (Pa) |
|---|---|---|---|---|---|
| PRE. HEATING | WARM AIR | — | 160-180 | 120 | ATMOSPHERIC PRESSURE |
| MELTING | WARM AIR | — | 245 | 10 | ATMOSPHERIC PRESSURE |
| PRESSURE REDUCTION & TILTING | INFRARED HEATER | — | 225-245 | 30 | 1 |
| COOLING | AIR COOLING | 6 | — | — | ATMOSPHERIC PRESSURE |

As illustrated by way of example in Table 1, the temperature is maintained at 160° C. to 180° C. for 120 s by, for example, a heating method using warm air. The hot melt joining material 13, which is the lead-free solder, has yet to melt at this temperature.

Next, the melting process including step S12 is performed. In the melting process, the hot melt joining material 13, which is the lead-free solder, provided between the board 11 and the component to be joined 15 is caused to melt by heating. FIG. 2A is a cross-sectional view of the object of processing 10 after being subjected to the process of step S12.

According to this embodiment, as described above, the lead-free solder having a melting point of 217° C. is used as the hot melt joining material 13. Therefore, as illustrated by way of example in Table 1, the temperature is maintained at 245° C. for 10 s by, for example, a heating method using warm air. As a result, the hot melt joining material 13, or the lead-free solder, melts.

Further, as described above using Eq. (1), an oxide of tin (Sn) in the hot melt joining material (lead-free solder) 13 reacts with a carboxylic acid contained in a flux to generate water, which turns into vapor to generate voids 16 (FIG. 2A) in the hot melt joining material (lead-free solder) 13. As illustrated in FIG. 2A, the voids 16 of different (large and small) sizes are generated in the hot melt joining material (lead-free solder) 13.

Next, the pressure reduction and tilting process is performed. The pressure reduction and tilting process includes step S13 and step S14.

Figure 2B:
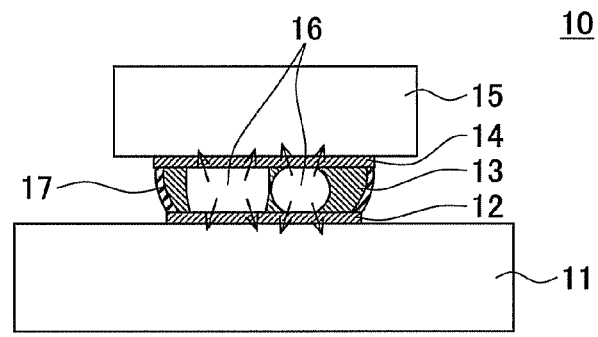

First, step S13 is performed. Step S13 is a process to reduce the pressure of the ambient atmosphere of the hot melt joining material (lead-free solder) 13. FIG. 2B is a cross-sectional view of the object of processing 10 after the process of step S13. Step S13 is performed in order to expand the multiple voids 16 into a single void.

Figure 2C:
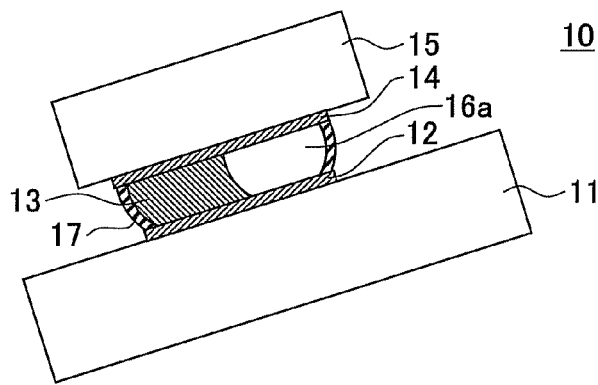

Of the voids 16 of different sizes generated in step S12, the smaller one is less buoyant than the larger one, thus being slower in moving upward in the case of tilting the board 11 of the object of processing 10. Accordingly, in order to increase the moving speed of the voids 16 including the smaller one, the voids 16 are caused to expand. The expanded voids 16 come into contact and merge with each other. As a result, the multiple voids 16 are combined into a single large void 16a (FIG. 2C).

Next, step S14 is performed. Step S14 is a process to tilt the board 11 of the object of processing 10 while applying heat from above using an infrared heater or the like. FIG. 2C is a cross-sectional view of the object of processing 10 after being subjected to the process of step S14. Step S14 is performed in order to cause the void 16a to move to one side of the hot melt joining material (lead-free solder) 13.

The hot melt joining material (lead-free solder) 13 is higher in relative density than the void 16a including vapor. Accordingly, the object of processing 10 including the board 11, the component to be joined 15, and the hot melt joining material (lead-free solder) 13 is tilted in order to cause the void 16a to be moved to one side of the hot melt joining material (lead-free solder) 13 by a buoyant force.

According to this embodiment, as illustrated by way of example in Table 1, step S13 and step S14 are performed as a series of processes, and after reducing pressure to a vacuum of 1 Pa, the board 11 is tilted for 30 s while the temperature is maintained at 225° C. to 245° C. using an infrared heater.

The void 16a of a lower relative density in the molten hot melt joining material (lead-free solder) 13 of a higher relative density has the property of concentrating on the upper side because of a buoyant force generated in the void 16a. Accordingly, by providing a vertical difference between one and the other side of the board 11 of the object of processing 10 by tilting the board 11, the void 16a is caused to concentrate on the upper side of the hot melt joining material (lead-free solder) 13. Further, the degree of freedom of the movement of the void 16a in the molten hot melt joining material (lead-free solder) 13 is high so that the void 16a moves upward in a fluid manner along the electrode 14 of the component to be joined 15 to be joined to the board 11.

Figure 2D:
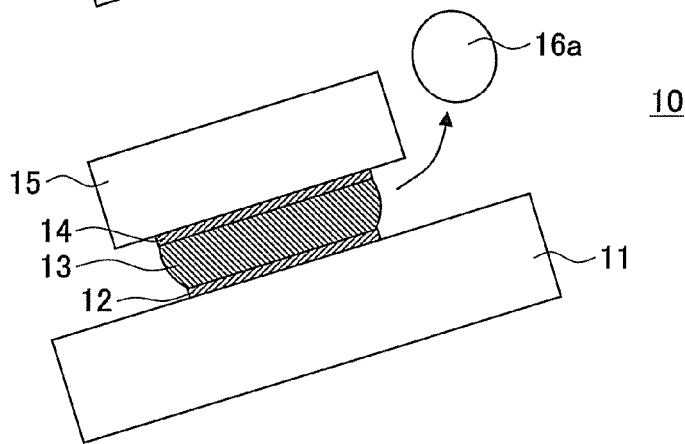

Next, the reducing gas feed process including step S15 is performed. In the reducing gas feed process, a reducing gas is fed to the ambient atmosphere of the molten hot melt joining material (lead-free solder) 13 while the board 11 of the object of processing 10 remains tilted. FIG. 2D is a cross-sectional view of the object of processing 10 after being subjected to step S15. Step S15 is performed in order to remove an oxide film 17 (FIGS. 2B and 2C) formed on the peripheral surface of the molten hot melt joining material (lead-free solder) 13 and discharge the void 16a outside the molten hot melt joining material (lead-free solder) 13.

As a result of step S14, the void 16a concentrates on the upper side of the molten hot melt joining material (lead-free solder) 13 with good fluidity. However, an oxide film may be formed on the peripheral surface of the hot melt joining material 13. When lead-free solder, which is used as the molten hot melt joining material 13 in this embodiment, is exposed to a high-temperature atmosphere, an oxide film that mainly contains tin oxide (SnO) formed as a result of oxidation of tin (Sn) is formed on the outside surface of the lead-free solder. Formation of the oxide film 17 containing tin oxide (SnO) makes it difficult for the void 16a to be discharged outside the molten hot melt joining material (lead-free solder) 13 because of poor fluidity of the oxide film 17. Accordingly, in step S15, a reducing gas is fed around the molten hot melt joining material (lead-free solder) 13 to reduce and remove the oxide film 17.

Immediately after the pressure reduction and tilting process, hydrogen gas, which is a reducing gas, is fed around the molten hot melt joining material (lead-free solder) 13 at a temperature of 225° C. to 245° C., which is the temperature condition of the pressure reduction and tilting process illustrated by way of example in Table 1, with the board 11 of the object of processing 10 being tilted 10 degrees. As a result, the oxide film 17 formed on the peripheral surface of the molten hot melt joining material (lead-free solder) 13 in FIGS. 2B and 2C is removed. As a result, the void 16a is discharged outside the molten hot melt joining material (lead-free solder) 13 from its upper side as illustrated in FIG. 2D.

Finally, the cooling process including step S16 and step S17 is performed. Step S16 is a process to stop the feeding of the reducing gas, return the board 11 to a horizontal position, and restore atmospheric pressure. Step S17 is a process to stop heating and perform cooling. As illustrated by way of example in Table 1, cooling is performed to normal temperature at a cooling rate of 6° C./s by, for example, air cooling.

According to the joining method of this embodiment, the pressure of the ambient atmosphere of the hot melt joining material (lead-free solder) 13 is reduced, so that small voids gather into a larger one. This eliminates the necessity of monitoring small voids in the hot melt joining material (lead-free solder) 13.

Further, according to the joining method of this embodiment, the board 11 of the object of processing 10 is heated using an infrared heater in step S14. However, the board 11 may be heated using an infrared heater in step S13 as well in order to prevent the molten hot melt joining material (lead-free solder) 13 from solidifying.

Further, according to the joining method of this embodiment, after step S13 is performed for evacuation (reducing pressure to a vacuum), step S14 is performed to tilt the board 11 of the object of processing 10. However, step S13 and step S14 may be performed simultaneously. Further, the order of performing step S13 and step S14 may be reversed so as to perform step S13 to perform evacuation after performing step S14 to tilt the board 11 of the object of processing 10. In this case, the board 11 of the object of processing 10 may be heated using an infrared heater both in step S14 and in step S13. Further, the board 11 of the object of processing 10 may be heated using an infrared heater in step S13 without using the infrared heater in step S14 preceding step S13.

Further, step S16 and step S17 do not have to be performed sequentially and may be performed simultaneously.

Next, a description is given, with reference to FIG. 3 and FIGS. 4A, 4B, 4C, and 4D, of a reflow apparatus 20 employed in the joining method according to this embodiment.

Figure 4A:
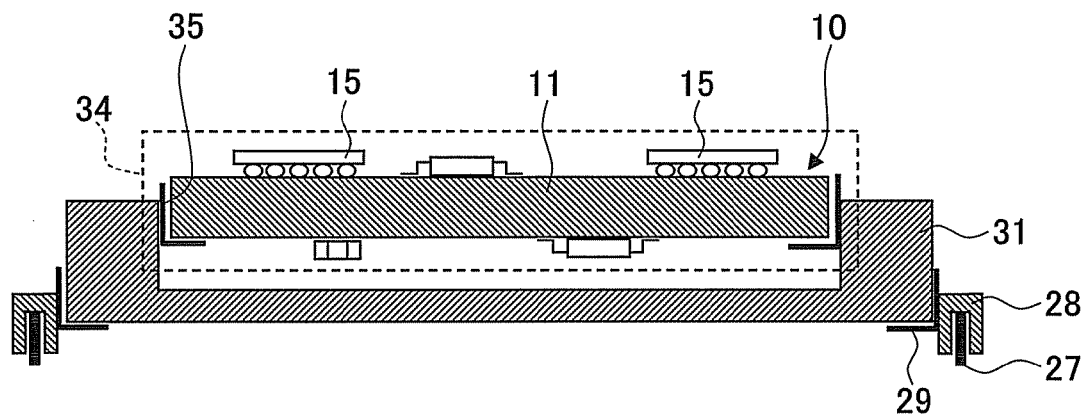
Figure 4B:
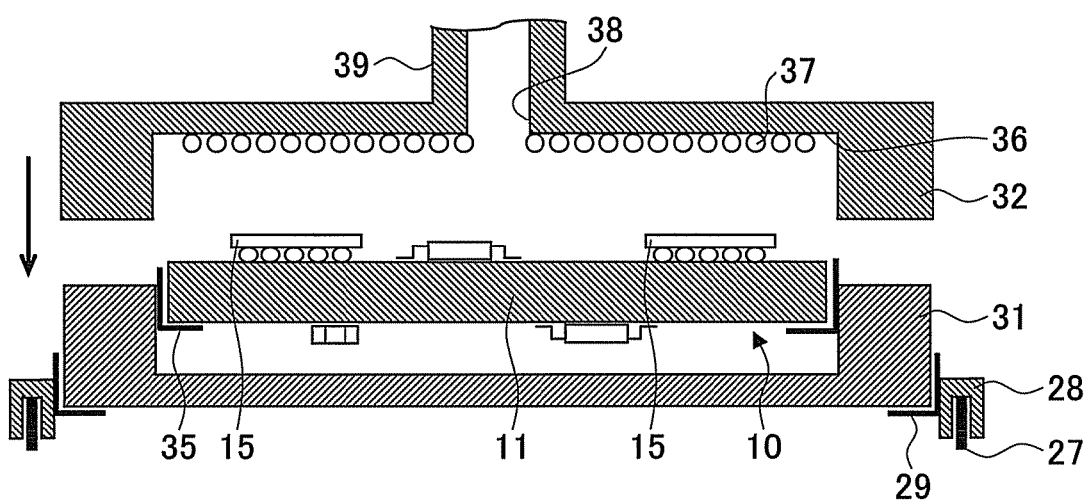
Figure 4C:
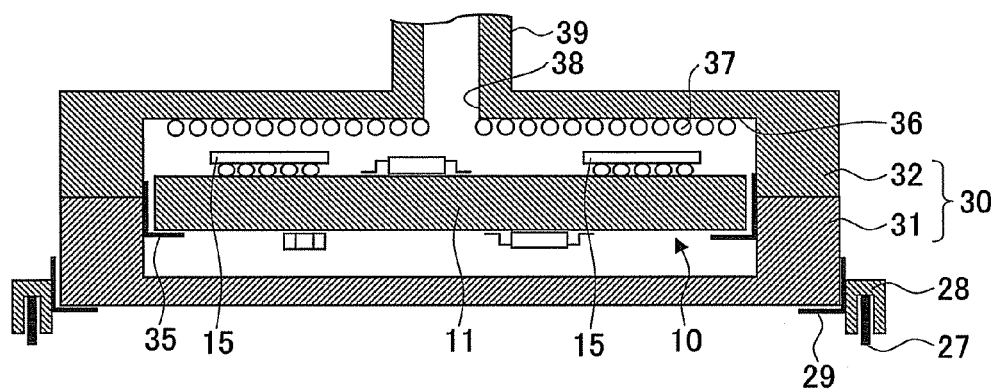
Figure 4D:
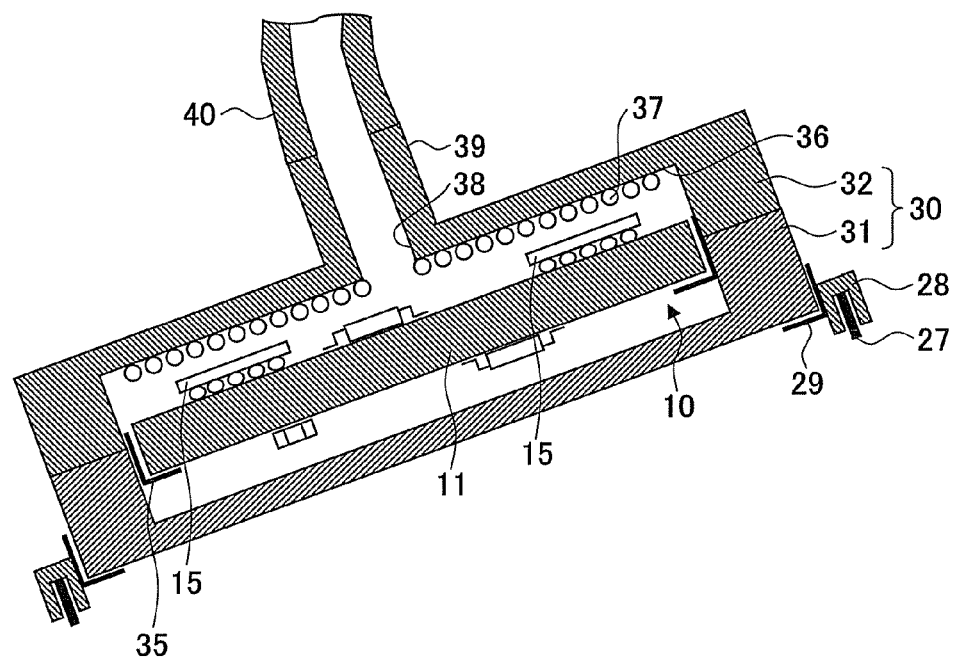

FIG. 3 is a schematic cross-sectional view of the reflow apparatus 20 according to this embodiment. FIGS. 4A through 4D are diagrams for illustrating the reflow apparatus 20 according to this embodiment. FIGS. 4A through 4D are cross-sectional views of a process vessel body part 31 and/or a process vessel upper lid part 32 when viewed in the direction indicated by arrow A in FIG. 3, illustrating states before and after the process vessel upper lid part 32 is mounted on the process vessel body part 31 in a pressure reduction and tilting chamber 23 (FIG. 3). FIG. 4A illustrates a state before the process vessel upper lid part 32 is mounted on the process vessel body part 31. FIG. 4B illustrates a state where the process vessel upper lid part 32 is moving down from above. FIG. 4C illustrates a state where the process vessel body part 31 has been conveyed into the pressure reduction and tilting chamber 23 and the process vessel upper lid part 32 is mounted on the process vessel body part 31 so that a process vessel 30 is formed. FIG. 4D illustrates a state where the process vessel 30 has been conveyed into a tilt zone 48 (FIG. 3) of the pressure reduction and tilting chamber 23 and is tilted.

As illustrated in FIG. 3, the reflow apparatus 20 includes four process chambers, that is, a preliminary heating chamber 21, a heating chamber 22, the pressure reduction and tilting chamber 23, and a cooling chamber 24; a conveyance part 25; multiple process vessel body parts 31; and the process vessel upper lid part 32. The preliminary heating chamber 21, the heating chamber 22, the pressure reduction and tilting chamber 23, and the cooling chamber 24 each have an opening serving as an entrance and an opening serving as an exit, and are linearly arranged side by side in this order (from the upstream side in the direction in which the process vessel body parts 31 are conveyed by the conveyance part 25). The entrance of each of the chambers 22, 23, and 24 is integrated with the exit of the preceding chamber. The entrance of the preliminary heating chamber 21 is integrated with the outside of the entrance of the reflow apparatus 20. The exit of each of the chambers 21, 22, and 23 is integrated with the entrance of the subsequent chamber. The exit of the cooling chamber 24 is integrated with the outside of the exit of the reflow apparatus 20. Further, a conveyance path 26 is provided that starts from the entrance of the preliminary heating chamber 21 to reach the exit of the cooling chamber 24 through the chambers 21, 22, 23, and 24.

As illustrated in FIG. 3, the conveyance part 25 includes the conveyance path 26 and a motor (not graphically illustrated) for conveying the process vessel body parts 31 along the conveyance path 26. The conveyance part 25 further includes a pair of conveyance rails 27 provided along the conveyance path 26 to guide and hold the process vessel body parts 31 from both sides of the conveyance path 26. As illustrated in FIGS. 4A through 4D, a conveyance chain 28 is provided on each conveyance rail 27. The conveyance chains 28 move on the corresponding conveyance rails 27 in synchronization with the process vessel body parts 31. Receivers 29 for supporting the process vessel body parts 31 are provided on the conveyance chains 28.

As illustrated in FIG. 3 and FIGS. 4A through 4D, each of the process vessel body parts 31 has an opening 34 that is open upward and a board holding part 35 inside the opening 34. The board holding part 35 holds the board 11 of the object of processing 10. Each of the process vessel body parts 31 houses the corresponding object of processing 10 having the component to be joined 15 mounted on the board 11 through the hot melt joining material 13. Each of the process vessel body parts 31 houses, for example, one object of processing 10.

Next, a description is given of the chambers 21 through 24 of the reflow apparatus 20 in accordance with the order in which the process vessel body parts 31 are conveyed along the conveyance path 26. First, a process vessel body part 31 is conveyed into the preliminary heating chamber 21 along the conveyance path 26.

The preliminary heating chamber 21 is a process chamber for performing the preliminary heating process including step S11, where the object of processing 10 is subjected to preliminary heating at a temperature not so high as to melt the hot melt joining material 13. The preliminary heating chamber 21 includes a warm air feeding mechanism 41. For example, as illustrated in FIG. 3, the warm air feeding mechanism 41 may feed warm air from the upper side in the preliminary heating chamber 21 so as to control the temperature of the object of processing 10 housed in the process vessel body part 31 conveyed in the preliminary heating chamber 21. As illustrated by way of example in Table 1, the temperature is maintained at, for example, 160° C. to 180° C. inside the preliminary heating chamber 21, and the reflow apparatus 20 is designed so that the process vessel body part 31 is conveyed from the entrance to the exit of the preliminary heating chamber 21 in, for example, 120 s. The process vessel body part 31 that has exited the preliminary heating chamber 21 is then conveyed into the heating chamber 22 along the conveyance path 26.

The heating chamber 22 is a process chamber for performing the melting process including step S12, where the object of processing 10 is heated to melt the hot melt joining material 13. The heating chamber 22 includes a warm air feeding mechanism 42. For example, as illustrated in FIG. 3, the warm air feeding mechanism 42 may feed warm air from the upper side in the heating chamber 22 so as to melt the hot melt joining material 13 of the object of processing 10 housed in the process vessel body part 31 conveyed in the heating chamber 22. As illustrated by way of example in Table 1, the temperature is maintained at, for example, 245° C. inside the heating chamber 22, and the reflow apparatus 20 is designed so that the process vessel body part 31 is conveyed from the entrance to the exit of the heating chamber 22 in, for example, 10 s. The process vessel body part 31 that has exited the heating chamber 22 is then conveyed into the pressure reduction and tilting chamber 23 along the conveyance path 26.

The pressure reduction and tilting chamber 23 is a process chamber for performing the pressure reduction and tilting process including step S13 and step S14. In the pressure reduction and tilting chamber 23, the pressure of the ambient atmosphere of the hot melt joining material 13 is reduced, and the board 11 of the object of processing 10 is tilted while performing auxiliary heating from above using an infrared heater if there is a decrease in the temperature of the object of processing 10.

As illustrated in FIG. 3, the pressure reduction and tilting chamber 23 includes the process vessel upper lid part 32 that is movable in an upward direction and a downward direction above the conveyance path 26 and in a forward direction and a backward direction along the conveyance path 26. The pressure reduction and tilting chamber 23 further includes an actuator part 43 capable of moving the process vessel upper lid part 32 in upward and downward directions and in forward and backward directions.

As illustrated in FIG. 4B, the process vessel upper lid part 32 is mounted from above on the process vessel body part 31 that has been conveyed into the pressure reduction and tilting chamber 23 along the conveyance path 26 so as to close or cover the opening 34 of the process vessel body part 31. As illustrated in FIG. 4C, the process vessel upper lid part 32 mounted on the process vessel body part 31 so as to close or cover its opening 34 is combined (integrated) with the process vessel body part 31 to form the airtight process vessel 30.

As illustrated in FIGS. 4B and 4C, the process vessel upper lid part 32 includes an evacuation port/feed port 38 on a ceiling surface 36, and is connected to an evacuation pipe/feed pipe 39 through the evacuation port/feed port 38. The evacuation pipe/feed pipe 39 is provided for evacuating the airtight process vessel 30 and for feeding a reducing gas into the evacuated process vessel 30. The exhaust pipe/feed pipe 39 is connected to an evacuation unit 45 through a valve 44. Further, the exhaust pipe/feed pipe 39 is connected to a hydrogen gas feed system 47 through a valve 46. Further, the exhaust pipe/feed pipe 39 includes a pressure-resistant flexible pipe 40 as its part. As described below with reference to FIG. 4D, the pressure-resistant flexible pipe 40 is provided for connecting the process vessel 30 and the non-tiltable actuator part 43 even in the case of tilting the process vessel 30. The exhaust pipe/feed pipe 39 may be provided in a single body (unitary structure), but it is also possible to provide an independent exhaust pipe and an independent feed pipe separately.

Further, as illustrated in FIGS. 4B and 4C, the process vessel upper lid part 32 includes an infrared heater 37 in the vicinity of the ceiling surface 36. The infrared heater 37 is provided for preventing the hot melt joining material 13 heated and melted in advance in the heating chamber 22 from lowering in temperature (cooling) and solidifying in the case of forming the airtight process vessel 30 by mounting the process vessel upper lid body 32 on the process vessel body part 31. Further, selecting the wavelength of the infrared radiation of the infrared heater 37 makes it possible for the object of processing 10 to be exposed to infrared rays of such wavelength as to hardly be absorbed by the board 11 and the component to be joined 15 and to be absorbed selectively by the hot melt joining material (lead-free solder) 13. This makes it possible to perform a joining process with efficiency. The infrared heater 37 may be replaced with a lamp heater, a far infrared heater, or any other common heater depending on the material quality of the board 11, the component to be joined 15, and the hot melt joining material 13.

According to this embodiment, the paired conveyance rails 27 are provided at heights (vertical positions) different from each other in the tilt zone 48, which is part of the pressure reduction and tilting chamber 23. Therefore, the process vessel 30 that has been conveyed along the conveyance path 26 and has entered the tilt zone 48 leans to one of its lateral sides along the conveyance path 26 (so that one of its right and left sides is higher than the other) as illustrated in FIG. 4D. As a result, the board 11 of the object of processing 10 housed in the process vessel also leans (tilts).

A portion of the tilt zone 48, which is part of the pressure reduction and tilting chamber 23, where the conveyance rails 27 are provided at different heights may correspond to a tilt part according to an aspect of this embodiment.

When the process vessel body part 31 enters the pressure reduction and tilting chamber 23, first, the process vessel upper lid part 32 is caused to move lower by the actuator part 43, so that the process vessel upper lid part 32 is mounted on the process vessel body part 31 to form the airtight process vessel 30 (FIG. 4C). Next, as illustrated in step S13 of FIG. 1, with the valve 44 and the valve 46 illustrated in FIG. 3 being open and closed, respectively, the process vessel 30 is evacuated through the evacuation pipe/feed pipe 39 using the evacuation unit 45 having an opening adjustment and control mechanism (not graphically illustrated). During this, the process vessel upper lid body 32 is caused by the actuator part 43 to move forward along the conveyance path 26 in synchronization with the process vessel body part 31 conveyed along the conveyance path 26 by the conveyance part 25.

Next, when the process vessel 30 enters the tilt zone 48 of the pressure reduction and tilting chamber 23, as illustrated in step S14 of FIG. 1, with the process vessel 30 being evacuated, the object of processing 10 is heated from above using the infrared heater 37, and the board 11 of the object of processing 10, integrated with the process vessel 30, is tilted (FIG. 4D). Next, with the valve 44 and the valve 46 illustrated in FIG. 3 being closed and open, respectively, hydrogen gas is fed into the process vessel 30 through the evacuation pipe/feed pipe 39 using the hydrogen gas feed system 47 having a flow rate adjustment and control mechanism (not graphically illustrated). During this as well, the process vessel upper lid body 32 is caused by the actuator part 43 to move forward along the conveyance path 26 in synchronization with the process vessel body part 31 conveyed along the conveyance path 26 by the conveyance part 25. Further, the pressure-resistant flexible pipe 40 allows the process vessel upper lid part 32 to be connected to the actuator part 43 while maintaining the same tilt angle as the tilted process vessel body part 31.

Where the tilt zone 48 ends in the pressure reduction and tilting chamber 23, the right and left conveyance rails 27 are again level with each other along the conveyance path 26. Accordingly, the tilted process vessel 30 returns to a horizontal position, and the feeding of the reducing gas is stopped. Further, with the valve 44 and the valve 46 being open and closed, respectively, the process vessel 30 is evacuated through the evacuation pipe/feed pipe 39 using the evacuation unit 45. Thereafter, the valve 44 is also closed. Then, atmospheric pressure is restored in the process vessel 30 using a system for feeding inert gas such as $N_2$ gas (not graphically illustrated) connected to the evacuation pipe/feed pipe 39, and the process vessel upper lid part 32 is moved upward using the actuator part 43. The process vessel body part 31 from which the process vessel upper lid part 32 has been separated by its upward movement is conveyed to the cooling chamber 24 along the conveyance path 26.

The cooling chamber 24 is a process chamber for performing the cooling process including step S17, where the object of processing 10 housed in the process vessel body part 31 is cooled by air cooling. The object of processing 10 cooled in the cooling chamber 24 is conveyed outside the cooling chamber 24 while remaining housed in the process vessel body part 31.

According to the reflow apparatus 20 of this embodiment, the objects of processing 10 housed in the respective process vessel body parts 31 are successively conveyed one after another along the conveyance path 26 to be subjected to the preliminary heating process, the melting process, the pressure reduction and tilting process, and the reducing gas feed process. This is efficient in the case of performing a joining process in a mass production process.

According to the reflow apparatus 20 of this embodiment, the board 11 of the object of processing 10 is heated using the infrared heater 37 when tilted together with the process vessel 30 (as a unit) in the pressure reduction and tilting chamber 23. However, in order to prevent the molten hot melt joining material (lead-free solder) 13 from solidifying, the board 11 of the object of processing 10 may continue to be heated using the infrared heater 37 after the evacuation of the process vessel 30.

Further, according to the reflow apparatus 20 of this embodiment, after the process vessel 30 is formed in the pressure reduction and tilting chamber 23, the board 11 of the object of processing 10 is tilted together with the process vessel 30 while being heated with the infrared heater 37 after the evacuation of the process vessel 30. Alternatively, the board 11 of the object of processing 10 may be tilted together with the process vessel 30 simultaneously with the evacuation of the process vessel 30. Further, the process vessel 30 may be evacuated after the board 11 of the object of processing 10 is tilted together with the process vessel 30. In this case, the board 11 of the object of processing 10 may be heated using the infrared heater 37 when tilted together with the process vessel 30. Further, the board 11 of the object of processing 10 may be heated using the infrared heater 37 not when tilted together with the process vessel 30 but when the process vessel 30 is evacuated.

Thus, according to the joining method and the reflow apparatus of this embodiment, first, by reducing the ambient pressure of lead-free solder, which is a hot melt joining material, it is possible to expand multiple voids generated in the solder into a single void. Next, by tilting the board of an object of processing, it is possible to move the void to the upper-side end of the solder. Next, by removing an oxide film with a reducing gas, it is possible to discharge the void outside the solder. Accordingly, no void resides in the lead-free solder, which is a hot melt joining material, so that it is possible to ensure that voids are discharged outside the solder.

According to this embodiment, by way of example, lead-free solder is used as a hot melt joining material. However, this embodiment is also applicable in the case of using lead solder. Further, this embodiment is also applicable where a wide variety of hot melt materials other than solder, such as wax, are used as hot melt joining materials.

Further, the reducing gas is not limited to hydrogen gas, and may be any gas with a reducing characteristic. For example, known reducing gases such as carbon monoxide (CO) may be used.

First Variation of First Embodiment

Next, a description is given, with reference to FIG. 5 and FIGS. 6A, 6B, 6C, and 6D, of a joining method according to a first variation of the first embodiment.

In FIG. 5 and FIGS. 6A through 6D, the same elements as those described above are referred to by the same reference numerals, and a description thereof may be omitted. (The same applies hereinafter.)

Figure 6A:
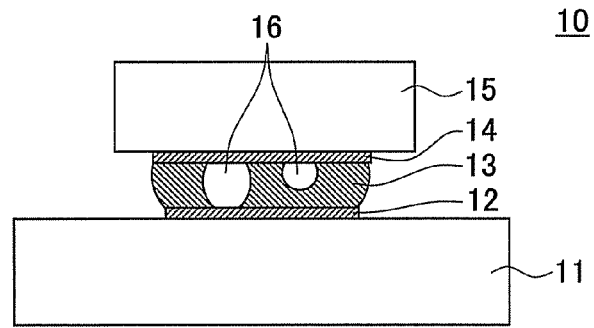

FIG. 5 is a flowchart for illustrating processes of a joining method according to this variation. FIGS. 6A through 6D, which are diagrams for illustrating the joining method according to this variation, are schematic cross-sectional views of the object of processing 10 in respective processes. The cross-sectional view of FIGS. 6A through 6D correspond to the object of processing 10 after the processes of steps S22, S23, S24, and S25, respectively, of FIG. 5. According to this variation as well, by way of example, the object of processing 10 includes the board 11 and the component to be joined 15, which is placed over the electrode 12 of the board 11 through the hot melt joining material 13 (with the hot melt joining material interposed between them) to have the electrode 14 joined to the board 11 as illustrated in FIG. 6A.

The joining method according to this variation is different from the joining method according to the first embodiment in that the reducing gas feed process is performed after a pressure reduction process and before a tilting process in the pressure reduction and tilting process.

As illustrated in FIG. 5, the joining method according to this variation includes a preliminary heating process, a melting process, a pressure reduction and tilting process, and a cooling process. The preliminary heating process includes the process of step S21. The melting process includes the process of step S22. The pressure reduction and tilting process includes the processes of step S23, step S24, and step S25. The cooling process includes the processes of step S26 and step S27. The pressure reduction and tilting process includes step S24, which is a reducing gas feed process, between step S23, which is a pressure reduction process, and step S25, which is a tilting process.

The preliminary heating process including step S21 and the melting process including step S22 are the same as step S11 and step S12, respectively, of the first embodiment (FIG. 1). Further, FIG. 6A is a cross-sectional view of the object of processing 10 after step S22.

Figure 6B:
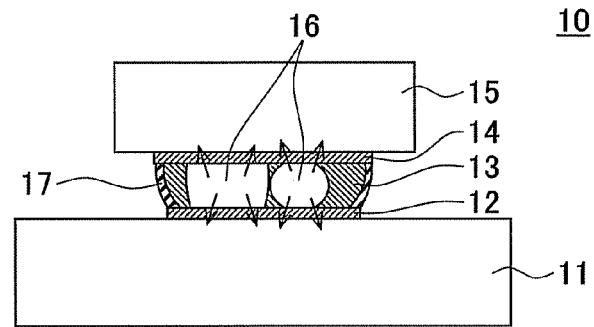

Further, in the pressure reduction and tilting process, the pressure reduction process of step S23 is the same as step S13 in the first embodiment (FIG. 1). FIG. 6B is a cross-sectional view of the object of processing 10 after step S23.

Figure 6C:
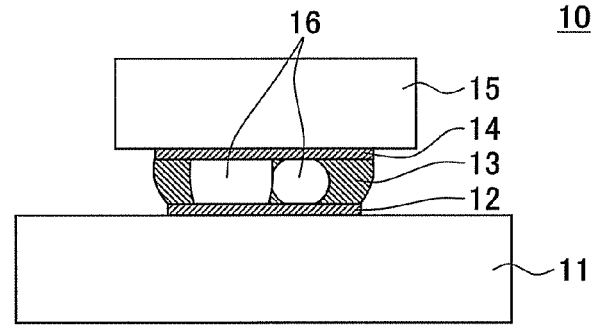

According to this variation, the reducing gas feed process including step S24 is performed after step S23. The reducing gas feed process in this variation is different from step S15 in the first embodiment in feeding a reducing gas around the hot melt joining material 13 without tilting the board 11 of the object of processing 10. FIG. 6C is a cross-sectional view of the object of processing 10 after step S24. The oxide film 17 formed on the peripheral surface of the hot melt joining material (lead-free solder) 13 is removed by performing step S24.

Figure 6D:
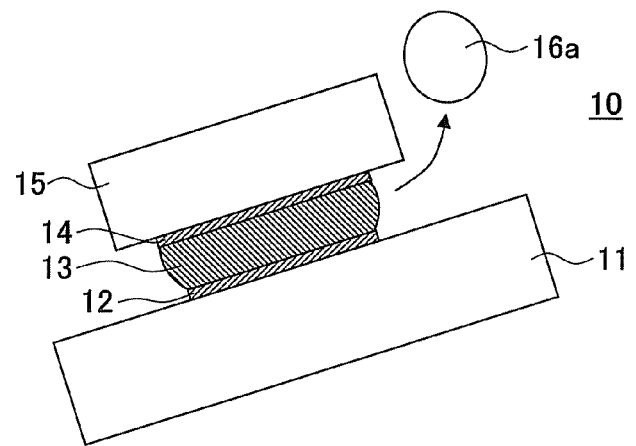

Next, step S25 is performed. Step S25 is a process to tilt the board 11 of the object of processing while being heated from above using an infrared heater. FIG. 6D is a cross-sectional view of the object of processing 10 after step S25.

By tilting the board 11 of the object of processing 10 by performing step S25, the multiple voids 16 concentrate on the upper side in the hot melt joining material (lead-free solder) with good fluidity to become the single void 16a. Further, unlike in the first embodiment, the oxide film 17 is not formed on the peripheral surface of the hot melt joining material (lead-free solder) 13. As a result, the void 16a is discharged outside the hot melt joining material (lead-free solder) 13 from its upper side with ease. Accordingly, in this variation, it is possible to discharge the void 16a outside the hot melt joining material (lead-free solder) 13 earlier than in the first embodiment immediately after tilting the board 11 of the object of processing 11.

Thereafter, the cooling process including step S26 and step S27 is performed the same as in the first embodiment. Further, step S26 and step S27 may be performed simultaneously the same as in the first embodiment.

Thus, according to the joining method of this variation, multiple voids generated in lead-free solder, which is a hot melt joining material, are expanded into a single void by reducing the ambient pressure of the lead-free solder. Then, after removing an oxide film with a reducing gas, the object of processing is tilted to move the void to the upper side end of the solder. As a result, it is possible to discharge the void outside the solder immediately after tilting the object of processing.

This variation is also applicable in the case of using lead solder. Further, this embodiment is also applicable where a wide variety of hot melt materials other than solder, such as wax, are used as hot melt joining materials.

Further, the reducing gas is not limited to hydrogen gas. For example, known reducing gases such as carbon monoxide (CO) may be used in addition to hydrogen gas.

According to the joining method of this variation, the board 11 is heated using an infrared heater in step S25. However, in order to prevent the molten hot melt joining material (lead-free solder) 13 from solidifying, the board 11 may be heated using an infrared heater in step S23 or step S24 as well.

Second Variation of First Embodiment

Next, a description is given, with reference to FIG. 7 and FIGS. 8A, 8B, and 8C, of a joining method according to a second variation of the first embodiment.

FIG. 7 is a flowchart for illustrating processes of a joining method according to this variation. FIGS. 8A through 8C, which are diagrams for illustrating the joining method according to this variation, are schematic cross-sectional views of the object of processing 10 in respective processes. The cross-sectional view of FIGS. 8A through 8C correspond to the object of processing 10 after the processes of steps S32, S33, and S34, respectively, of FIG. 7. According to this variation as well, by way of example, the object of processing 10 includes the board 11 and the component to be joined 15, which is placed over the electrode 12 of the board 11 through the hot melt joining material 13 to have the electrode 14 joined to the board 11 as illustrated in FIG. 8A.

The joining method according to this variation is different from the joining method according to the first embodiment in not including the reducing gas feed process.

As illustrated in FIG. 7, the joining method according to this variation includes a preliminary heating process, a melting process, a pressure reduction and tilting process, and a cooling process. The preliminary heating process includes the process of step S31. The melting process includes the process of step S32. The pressure reduction and tilting process includes the processes of step S33 and step S34. The cooling process includes the processes of step S35 and step S36.

The preliminary heating process including step S31 and the melting process including step S32 are the same as in the first embodiment. FIG. 8A is a cross-sectional view of the object of processing 10 after step S32.

Step S33 and step S34 included in the pressure reduction and tilting process are the same as step S13 and step S14, respectively, in the first embodiment (FIG. 1). FIGS. 8B and 8C are cross-sectional views of the object of processing 10 after step S33 and step S34, respectively.

On the other hand, according to this variation, no reducing gas feed process is performed after step S34. An oxide film formed on the periphery of lead-free solder, which is a hot melt joining material, is commonly not removed if no reducing gas feed process is performed. However, the degree of vacuum in the pressure reduction and tilting process is adjusted in a direction to increase (or the pressure inside the process vessel 30 is controlled in a direction to decrease), so that the temperature of the object of processing 10 is adjusted to decrease as much as possible within a range where the hot melt joining material (lead-free solder) 13 melts. Such adjustments make it possible for an oxide film to be hardly formed on the periphery of the hot melt joining material (lead-free solder) 13.

According to this variation, the board 11 of the object of processing 10 is heated using an infrared heater in step S34. However, in order to prevent the molten hot melt joining material (lead-free solder) 13 from solidifying, the board 11 of the object of processing 10 may be heated using an infrared heater in step S33 as well.

Further, according to this variation, step S34, which tilts the board 11 of the object of processing 10, is performed after performing step S33, which is an evacuation process. However, step S33 and step S34 may be performed simultaneously. Further, it is also possible to perform the evacuation process of step S33 after step S34, which tilts the board 11 of the object of processing 10. In this case, the board 11 of the object of processing 10 may be heated using an infrared heater in step S34 and step S33. Alternatively, the board 11 of the object of processing 10 may be heated using an infrared heater in step S33 without using the infrared heater in step S34.

Thereafter, the cooling process including step S35 and step S36 is performed. Step S35 and step S36 are the same as step S16 and step S17, respectively, in the first embodiment (FIG. 1) except for including no process for stopping the feeding of a reducing gas. Further, step S35 and step S36 may be performed simultaneously, which is the same as in the first embodiment.

Thus, according to the joining method of this variation, multiple voids generated in lead-free solder, which is a hot melt joining material, are expanded into a single void by reducing the ambient pressure of the lead-free solder to vacuum. Next, the object of processing is tilted to move the void to the upper side end of the lead-free solder. By controlling the vacuum to such a degree as to prevent formation of an oxide film on the outside surface of the lead-free solder, it is possible to ensure that the void is discharged outside the lead-free solder.

This variation is also applicable in the case of using lead solder. Further, this embodiment is also applicable where a wide variety of hot melt materials other than solder, such as wax, are used as hot melt joining materials.

Third Variation of First Embodiment

Next, a description is given, with reference to FIG. 9 and FIG. 10, of a joining method and a reflow apparatus according to a third variation of the first embodiment.

FIG. 9, which is a diagram for illustrating a reflow apparatus according to this variation, is a schematic cross-sectional view of a process vessel upper lid part 32a. FIG. 10 is a flowchart for illustrating processes of a joining method according to this variation.

The reflow apparatus according to this variation is different from the reflow apparatus 20 according to the first embodiment in that no infrared heater is provided on the process vessel upper lid part 32a. Further, the joining method according to this variation is different from the joining method according to the first embodiment in that no heating using an infrared heater is performed on the object of processing 10.

As illustrated in FIG. 9, the process vessel upper lid part 32a of this variation is the same as the process vessel upper lid part 32 in having the evacuation port/feed port 38 on the ceiling surface 36. On the other hand, unlike the process vessel upper lid part 32 of the first embodiment having the infrared heater 37 provided on the ceiling surface 36 (FIG. 4B through 4D), the process vessel upper lid part 32a of this variation has no infrared heater provided on the ceiling surface 36 as illustrated in FIG. 9.

Further, as illustrated in FIG. 10, the joining method according to this variation includes a preliminary heating process, a melting process, a pressure reduction and tilting process, a reducing gas feed process, and a cooling process. The preliminary heating process includes the process of step S41. The melting process includes the process of step S42. The pressure reduction and tilting process includes the processes of step S43 and step S44. The reducing gas feed process includes the process of step S45. The cooling process includes the processes of step S46 and step S47.

The preliminary heating process including step S41 and the melting process including step S42 are the same as step S11 and step S12, respectively, in the first embodiment (FIG. 1). Further, in the pressure reduction and tilting process, the pressure reduction process of step S43 is the same as step S13 in the first embodiment (FIG. 1).

On the other hand, according to this variation, the board 11 of the object of processing 10 is tilted without applying heat using an infrared heater in step S44. In the case of applying no heat using an infrared heater, a decrease in the temperature of the hot melt joining material (lead-free solder) 13 (FIGS. 2A through 2D, not graphically illustrated in FIG. 9) prevents the hot melt joining material (lead-free solder) 13 from being kept in a molten state. However, the heating temperature in the melting process is adjusted in advance to be higher than in the case of using an infrared heater, and the time of the pressure reduction and tilting process is adjusted in advance to be shorter than in the case of using an infrared heater. Such adjustments make it possible to keep the hot melt joining material (lead-free solder) 13 in a molten state without using an infrared heater while tilting the board 11 of the object of processing 10.

According to this variation, step S44, which tilts the board 11 of the object of processing 10, is performed after performing step S43, which is an evacuation process. However, step S43 and step S44 may be performed simultaneously. Further, it is also possible to perform the evacuation process of step S43 after performing step S44, which tilts the board 11 of the object of processing 10.

Thereafter, the reducing gas feed process including step S45 is performed, which is like performing step S15 in the first embodiment (FIG. 1). Further, performing the cooling step including step S46 and step S47 is the same as performing step S16 and step S17 in the first embodiment (FIG. 1). Further, step S46 and step S47 may be performed simultaneously the same as in the first embodiment.

Thus, according to the reflow apparatus and the joining method of this variation, it is possible to maintain lead-free solder, which is a hot melting joining material, in a molten state without applying heat using an infrared heater at the time of tilting the object of processing. As a result, it is possible to discharge a void outside the lead-free solder from its upper side end by tilting the object of processing.

This variation is also applicable in the case of using lead solder. Further, this embodiment is also applicable where a wide variety of hot melt materials other than solder, such as wax, are used as hot melt joining materials.

[b] Second Embodiment

Next, a description is given, with reference to FIG. 11 and FIG. 12, of a reflow apparatus according to a second embodiment.

FIG. 11 is a schematic cross-sectional view of a reflow apparatus 20a according to this embodiment. FIG. 12, which is a diagram for illustrating the reflow apparatus 20a according to this embodiment, is a cross-sectional view of the process vessel 30 when viewed in the direction indicated by arrow A in FIG. 11, illustrating a state where the process vessel 30 has been conveyed to a tilt zone 48a of a pressure reduction and tilting chamber 23a and is tilted in a single body.

The reflow apparatus 20a according to this embodiment is different from the reflow apparatus 20 according to the first embodiment in providing no difference in level (height) between conveyance rails 27a in the tilt zone 48a and including an actuator 49 that pushes one side of the process vessel body part 31 up from a conveyance path 26a in the tilt zone 48a.

As illustrated in FIG. 11, the reflow apparatus 20a according to this embodiment includes four process chambers, that is, the preliminary heating chamber 21, the heating chamber 22, the pressure reduction and tilting chamber 23a, and the cooling chamber 24; a conveyance part 25a; the multiple process vessel body parts 31; and the process vessel upper lid part 32. Of these, the preliminary heating chamber 21, the heating chamber 22, the cooling chamber 24, the process vessel body parts 31, and the process vessel upper lid part 32 are the same as in the first embodiment.

As illustrated in FIG. 11, the conveyance part 25a includes the conveyance path 26a and a motor (not illustrated) for conveying the process vessel body parts 31 along the conveyance path 26a. The same as in the first embodiment, the conveyance part 25a includes the conveyance rails 27a. Further, as illustrated in FIG. 12, conveyance chains 28a are provided on the conveyance rails 27a, and receivers 29a are provided on the conveyance chains 28a, which is also the same as in the first embodiment.

On the other hand, according to this embodiment, the conveyance rails 27a are provided at the same vertical level (height) in the tilt zone 48a of the pressure reduction and tilting chamber 23a as well. Instead, the actuator 49 that pushes one side of the process vessel body part 31 up from the conveyance path 26a is provided in the tilt zone 48a of the pressure reduction and tilting chamber 23a. The actuator 49 may correspond to a tilt part according to an aspect of this embodiment.

As illustrated in FIG. 11 and FIG. 12, the actuator 49 is provided in the tilt zone 48a of the pressure reduction and tilting chamber 23a so as to be able to push one side of the process vessel body part 31 up from and along the conveyance path 26a. The actuator 49 includes a roller 50 and a piston 51. As illustrated in FIG. 12, the roller 50 is provided so that one (lateral) side of the process vessel body part 31 is pushed up in such a manner as to allow the process vessel body part 31 to move along the conveyance path 26a. Further, as illustrated in FIG. 12, the piston 51 is provided to control the vertical position (height) of the end of the roller 50. The piston 50 is vertically moved so that one side of the process vessel body part 31 is continuously moved up to a predetermined vertical position (height), is thereafter held and conveyed at the predetermined position, and is thereafter moved down to be level with the conveyor rails 27a. The other parts of the pressure reduction and tilting chamber 23a are the same as those of the pressure reduction and tilting chamber 23 of the first embodiment.

According to this embodiment, paired conveyor rails are provided at the same vertical position (height), and an actuator to push up one side of a process vessel body part is provided separately from the conveyor rails. Then, by controlling the amount of the vertical movement of the actuator, the tilt angle of the object of processing is varied freely in accordance with a hot melt joining material such as solder, a board, and a component to be joined (to the board). As a result, it is possible to ensure that a void is discharged outside the hot melt joining material.

This variation is also applicable in the case of using lead solder. Further, this embodiment is also applicable where a wide variety of hot melt materials other than solder, such as wax, are used as hot melt joining materials.

Further, in this embodiment as well, hydrogen gas may be fed before pressure reduction and tilting the same as in the first variation of the first embodiment. Further, hydrogen gas may not be fed the same as in the second variation of the first embodiment. Further, the infrared heater 37 may not be provided on the process vessel upper lid part 32 the same as in the third variation of the first embodiment.

Thus, according to an aspect of the present invention, it is possible to ensure that a void is discharged outside a hot melt joining material such as lead-free solder at the time of joining a large-area component having terminals formed on its bottom surface to a board using the hot melt joining material.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:

1. A joining method, comprising:
    melting a hot melt joining material provided between a board and a component to be joined to the board in a first process vessel part;
    mounting a second process vessel part on the first process vessel part in which the hot melt joining material is in a molten state between the board and the component to be joined to the board to form a process vessel; and
    reducing a pressure of an ambient atmosphere of the hot melt joining material in the process vessel and tilting the board by tilting the process vessel while the hot melt joining material is in the molten state.

2. The joining method as claimed in claim 1, wherein the board is tilted after the pressure of the ambient atmosphere of the hot melt joining material is reduced in said reducing and tilting.

3. The joining method as claimed in claim 1, further comprising:
    feeding a reducing gas around the hot melt joining material after reducing the pressure of the ambient atmosphere of the hot melt joining material.

4. The joining method as claimed in claim 3, wherein the reducing gas is hydrogen gas.

5. The joining method as claimed in claim 1, further comprising:
    feeding a reducing gas around the hot melt joining material after reducing the pressure of the ambient atmosphere of the hot melt joining material and tilting the board.

6. The joining method as claimed in claim 5, wherein the reducing gas is hydrogen gas.

7. The joining method as claimed in claim 1, wherein the hot melt joining material is heated from above the board using an infrared heater in said reducing and tilting.

8. The joining method as claimed in claim 1, wherein the hot melt joining material is lead-free solder.

9. The joining method as claimed in claim 1, further comprising:
    holding and conveying the first process vessel part by a conveyance part,
    wherein said mounting mounts the second process vessel part on the first process vessel part held and conveyed by the conveyance part.

10. The joining method as claimed in claim 1, further comprising:
    conveying the first process vessel part from a first chamber to a second chamber,
    wherein said melting is performed in the first chamber, and said mounting and said reducing are performed in the second chamber.

* * * * *